(12) United States Patent
Guzman-Casillas (10) Patent No.: US 8,655,608 B2
(45) Date of Patent: Feb. 18, 2014

(54) SYMMETRICAL COMPONENT AMPLITUDE AND PHASE COMPARATORS FOR LINE PROTECTION USING TIME STAMPED DATA

(75) Inventor: Armando Guzman-Casillas, Pullman, WA (US)

(73) Assignee: Schweitzer Engineering Laboratories Inc, Pullman, WA (US)

( * ) Notice: Subject to any disclaimer, the term of this patent is extended or adjusted under 35 U.S.C. 154(b) by 1182 days.

(21) Appl. No.: 12/239,615

(22) Filed: Sep. 26, 2008

(65) Prior Publication Data

US 2009/0088989 A1    Apr. 2, 2009

Related U.S. Application Data

(60) Provisional application No. 60/976,245, filed on Sep. 28, 2007.

(51) Int. Cl.
*G01R 31/02* (2006.01)
(52) U.S. Cl.
USPC .............................. 702/58; 361/62; 324/522
(58) Field of Classification Search
CPC ......... H02H 3/00; H02H 7/045; G01R 31/02; G01N 33/00; G01N 33/497; G01N 7/00; G01L 7/00; A62B 7/00; G01F 19/00; G01F 1/00; A61B 5/083; A61B 5/08; A61B 5/097; A61B 5/02; A61B 5/00; A61B 17/00; A61B 5/087; A61K 49/06; A61K 49/04; G06T 11/20; G01J 5/00
USPC .......... 702/57, 58, 64, 65, 79; 361/36, 44, 45, 361/63
See application file for complete search history.

(56) References Cited

U.S. PATENT DOCUMENTS 4,292,513 A * 9/1981 Simmons et al. ............. 250/205
4,719,469 A   1/1988 Beier
(Continued)

FOREIGN PATENT DOCUMENTS

| EP | 1324454 | 7/2003 |
|----|---------|--------|
| EP | 1324455 | 7/2003 |

(Continued)

OTHER PUBLICATIONS

Saman A. Zonouz and William H. Sanders, A Kalman-Based Coordination for Hierarchical State Estimation: Algorithm and Analysis Jan. 7, 2008.

(Continued)

*Primary Examiner* — John Breene
*Assistant Examiner* — Ruihua Zhang
(74) *Attorney, Agent, or Firm* — Stoel Rives LLP (57) ABSTRACT

A set of current measurements may be transmitted from a remote Intelligent Electronic Device (IED) to a local IED. The current measurements may comprise a timestamp and/or be associated with timestamp information to allow the local IED to time align the local current measurement with the remote current measurement. The local IED may detect a fault within the power system segment defined by the local and remote IEDs by comparing an operating current to a scaled restraint current. A fault may also be detected by comparing the operating current to a scaled nominal current. The operating and restraint currents may be derived from the local and remote current measurements. The restraint current scale may be derived from the characteristics of the local and/or remote IED. The current measurements may correspond to a negative-sequence component and/or a zero-sequence component of a three-phase current measurement set.

27 Claims, 7 Drawing Sheets

(56) References Cited

U.S. PATENT DOCUMENTS

| | | | |
|---|---|---|---|
| 4,821,294 | A | 4/1989 | Thomas |
| 4,829,298 | A | 5/1989 | Fernandes |
| 5,006,846 | A | 4/1991 | Granville |
| 5,224,011 | A | 6/1993 | Yalla |
| 5,446,682 | A | 8/1995 | Janke |
| 5,498,956 | A | 3/1996 | Kinney |
| 5,592,393 | A | 1/1997 | Yalla |
| 5,680,324 | A | 10/1997 | Schweitzer |
| 5,736,961 | A | 4/1998 | Fenton |
| 5,963,582 | A | 10/1999 | Stansell |
| 5,995,911 | A | 11/1999 | Hart |
| 6,075,987 | A | 6/2000 | Camp |
| 6,104,729 | A | 8/2000 | Hellum |
| 6,127,970 | A | 10/2000 | Lin |
| 6,141,196 | A | 10/2000 | Premerlani |
| 6,160,841 | A | 12/2000 | Stansell |
| 6,236,949 | B1 | 5/2001 | Hart |
| 6,252,863 | B1 | 6/2001 | Raby |
| 6,313,934 | B1 | 11/2001 | Fortenberry |
| 6,429,785 | B1 | 8/2002 | Griffin |
| 6,442,010 | B1 | 8/2002 | Kasztenny |
| 6,446,682 | B1 | 9/2002 | Viken |
| 6,483,680 | B1 * | 11/2002 | Kulidjian et al. ............... 361/36 |
| 6,507,184 | B1 * | 1/2003 | Elston ............... 324/107 |
| 6,518,767 | B1 * | 2/2003 | Roberts et al. ............... 324/521 |
| 6,570,534 | B2 | 5/2003 | Cohen |
| 6,603,298 | B2 | 8/2003 | Guzman-Casillas |
| 6,618,648 | B1 | 9/2003 | Shirota |
| 6,624,760 | B1 | 9/2003 | Kinzel |
| 6,642,700 | B2 | 11/2003 | Slade |
| 6,662,124 | B2 | 12/2003 | Schweitzer |
| 6,671,654 | B1 | 12/2003 | Forth |
| 6,687,627 | B1 | 2/2004 | Gunn |
| 6,694,270 | B2 | 2/2004 | Hart |
| 6,735,523 | B1 | 5/2004 | Lin |
| 6,735,535 | B1 | 5/2004 | Kagan |
| 6,745,175 | B2 | 6/2004 | Pierce |
| 6,751,653 | B2 | 6/2004 | Austin |
| 6,754,597 | B2 | 6/2004 | Bertsch |
| 6,762,714 | B2 | 7/2004 | Cohen |
| 6,845,301 | B2 | 1/2005 | Hamamatsu |
| 6,845,333 | B2 | 1/2005 | Anderson |
| 6,853,978 | B2 | 2/2005 | Forth |
| 6,859,742 | B2 * | 2/2005 | Randall et al. ............... 702/61 |
| 6,934,654 | B2 | 8/2005 | Benmouyal |
| 6,944,555 | B2 | 9/2005 | Blackett |
| 6,961,753 | B1 | 11/2005 | Osburn |
| 6,983,393 | B2 | 1/2006 | Truchard |
| 2001/0012984 | A1 | 8/2001 | Adamiak |
| 2003/0161084 | A1* | 8/2003 | Potts et al. ............... 361/62 |
| 2003/0220752 | A1 | 11/2003 | Hart |
| 2004/0059469 | A1 | 3/2004 | Hart |
| 2004/0093177 | A1 | 5/2004 | Schweitzer |
| 2004/0167729 | A1 | 8/2004 | Saha |
| 2004/0169518 | A1* | 9/2004 | Saha et al. ............... 324/522 |
| 2004/0196603 | A1* | 10/2004 | Schweitzer et al. ............ 361/62 |
| 2006/0029105 | A1 | 2/2006 | Kasztenny |
| 2006/0198065 | A1* | 9/2006 | Guzman-Casillas et al. ... 361/35 |
| 2006/0224336 | A1 | 10/2006 | Petras |
| 2006/0247874 | A1 | 11/2006 | Premerlani |
| 2006/0259255 | A1 | 11/2006 | Anderson |
| 2007/0086134 | A1* | 4/2007 | Zweigle et al. ............... 361/85 |
| 2007/0150214 | A1 | 6/2007 | Qin |
| 2007/0198709 | A1 | 8/2007 | Hawkinson |
| 2008/0158750 | A1* | 7/2008 | Premerlani et al. ............ 361/63 |

FOREIGN PATENT DOCUMENTS

| | | | |
|---|---|---|---|
| WO | 03055028 | 7/2003 | |
| WO | 2005064759 | 7/2005 | |
| WO | WO 2005/064759 A1 * | 7/2005 | |
| WO | WO 2005064759 A1 * | 7/2005 | ............ H02H 7/045 |

OTHER PUBLICATIONS

Fernando Calero, Schweitzer Engineering Laboratories, Inc., Rebirth of Negative-Sequence Quantities in Protective Relaying with Microprocessor-Based Relays 2003.

A.P. Sakis Meliopoulos, George J. Cokkinides, Floyd Galvan, Bruce Fadanesh, Distributed State Estimator-Advances and Demonstration, Jan. 7, 2008.

ABB: Improved Power System Performance through Wide Area Monitoring, Protection, and Control, 2004.

ABB Wide Area Measurement, Monitoring, Protection and Control Industrial IT for Energy System Operation—http://library.abb.com/GLOBAL/SCOT/scot221.nsf/VerityDisplay/E1755E3F1F32890EC1256E3F0041D8F4/$File/741_PSG_Basic_rev3_A4_US_CH.pdf (2003).

Dmetrios Tziouvaras, Hector Altuve, Gabriel Benmouyal, Jeff Roberts, Line Differential Protection with Enhanced Characteristic, Nov. 4-6, 2002.

Gabriel Benmouyal, Joe B. Mooney, Advanced Sequence Elements for Line Current Differential Protection, May 2, 2007.

Gabriel Benmouyal, The Trajectories of Line Current Differential Faults in the Alpha Plane, Oct. 2005.

PCT/US2008/078016 Patent Cooperation Treaty, International Search Report and Written Opinion of the International Searching Authority, Dec. 2, 2008.

Kim, Lab 2.3-Phase Watts, Vars, and Volt-Amperes: In:EECE 324 Energy Conversion Lab Manual (online) 2003, Retrieved Nov. 27, 2008, http://www.hirstbrook.com/energylab/Lab%202.pdf.

Zima Special Production Schemes in Electric Power Systems:Literature Survey (online) Jun. 6, 2002 p. 1-22 http://www.eeh.ee.ethz.ch/fileadmin/user_upload/eeh/publications/psl/zima_survey.pdf.

Improved Power System Performance through Wide Area Monitoring, Protection, and Control, ABB, 2004.

PCT International Search Report for PCT/US2008/078175, Sep. 12, 2008.

PCT Written Opinion of the International Searching Authority for PCT/US2008/078175, Sep. 12, 2008.

R.O. Burnett, Jr., M.M. Butts, T.W. Cease, V. Centeno, G. Michel, R. J. Murphy, A. G. Phadke, Synchronized Phasor Measurements of a Power System Event—IEEE Transactions on Power, Aug. 3, 1994 (pp. 1643-1650; vol. 9, No. 3).

Mark Adamiak, Dr. William Premerani, Dr. Bogdan Kasztenny, Synchrophasors: Definition, Measurement, and Application-Power Systems 2005 Conference, Marden Center, Clemson University, Mar. 8-11, 2005 dated Mar. 11, 2005.

Ragael San Vincente, Raul Cortes, Jaime Robles, J. Enrique Chong-Quero-DSP, Microcontroller Implementations of a Simplified Algorithm for Synchrophasor Calculation—2nd International conference on Electrical Engineering (CIE 2005), Mexico City, Mexico, Sep. 7-9, 2005 (pp. 408-411; IEEE Catalog No. 05EX1097.

Tsuyoshi Funaki, Shunsuke Tanaka, Error Estimation and Correction of DFT in Sychronized Phasor Measurement-Transmission Transmission and Distribution Conference and Exhibition 2002: Asia Pacific, IEEE/PES , dated Aug. 6, 2002 (pp. 448-453, vol. 1).

A.G. Phadke, Synchronized Phasor Measurements—A Historical Overview-Transmission and Distribution Conference and Exhibition 2002: Asia Pacific, IEEE/PES, dated Aug. 6, 2002 (pp. 476-479, vol. 1).

Jian Li, Xiaorong Xie, Jinyu Xiao; Jingtao Wu, The Framework and Algorithm of a New Phasor Measurement Unit-2004 IEEE International Conference on Electric Utility Deregulation, Restructuring and Power Technologies (DROT2004) , Apr. 2004 Hong Kong dated Apr. 5, 2004 (pp. 826-831, vol. 2).

Yutaka Ota, Hiroyuki Ukai, Koichi Nakamura, Hideki Fujita, Evaluation of Stability and Electric Power Quality in Power System by Using Phasor Measurements—Power System Technology, 2000, Proceedings, PowerCon 2000, International Conference, dated Dec. 4, 2000 (pp. 1335-1340, vol. 3).

A.G. Phadke, Synchronized Phasor Measurements in Power Systems—IEEE Computer Applications in Power, dated Apr. 1993 (vol. 6).

(56) References Cited

OTHER PUBLICATIONS

Gabriel Benmouyal, E.O. Schweitzer, A. Guzman, Synchronized Phasor Measurement in Protective Relays for Protection, Control, and Analysis of Electric Power Systems—29th Annual Western Protective Relay Conference Spokane, Washington, Oct. 22-24, 2002 (also available at http://www.selinc.com/techpprs/6139.pdf).

National Instruments, Synchronizing and Correlating Measurements to a Global Timebase with GPS; http://zone.ni.com/devzone/cda/tut/p/id/4202 (visited on Sep. 7, 2006).

Enrique Martinez, Nicolas Juarex, Armando Guzman, Greg Zweigle, Jean Leon, Using Synchronized Phasor Angle Difference for Wide-Area Protection and Control; www.selinc.com/techpprs/TP6254_UsingSynchronizedPhasor_20060922.pdf, dated Sep. 22, 2006.

\* cited by examiner

Figure 10

SYMMETRICAL COMPONENT AMPLITUDE AND PHASE COMPARATORS FOR LINE PROTECTION USING TIME STAMPED DATA

RELATED APPLICATIONS

This Application claims priority to U.S. Provisional Application No. 60/976,245, entitled "Symmetrical Component Amplitude and Phase Comparators for Line Protection Using Time Stamped Data" filed Sep. 28, 2007, which is hereby incorporated by reference in its entirety.

TECHNICAL FIELD

This disclosure relates generally to systems and methods for detecting faults in power transmission systems and, more particularly, to a negative sequence current amplitude comparator to detect a fault in an electric power system using time-stamped, current measurements.

BRIEF DESCRIPTION OF THE DRAWINGS

Additional aspects and advantages will be apparent from the following detailed description of preferred embodiments, which proceeds with reference to the accompanying drawings.

DETAILED DESCRIPTION OF PREFERRED EMBODIMENTS

The embodiments of the disclosure will be best understood by reference to the drawings, wherein like elements are designated by like numerals throughout. In the following description, numerous specific details are provided for a thorough understanding of the embodiments described herein. However, those of skill in the art will recognize that one or more of the specific details may be omitted, or other methods, components, or materials may be used. In some cases, operations are not shown or described in detail.

Furthermore, the described features, operations, or characteristics may be combined in any suitable manner in one or more embodiments. It will also be readily understood that the order of the steps or actions of the methods described in connection with the embodiments disclosed may be changed as would be apparent to those skilled in the art. Thus, any order in the drawings or Detailed Description is for illustrative purposes only and is not meant to imply a required order, unless specified to require an order.

Embodiments may include various steps, which may be embodied in machine-executable instructions to be executed by a general-purpose or special-purpose computer (or other electronic device). Alternatively, the steps may be performed by hardware components that include specific logic for performing the steps or by a combination of hardware, software, and/or firmware.

Embodiments may also be provided as a computer program product including a computer-readable medium having stored thereon instructions that may be used to program a computer (or other electronic device) to perform processes described herein. The computer-readable medium may include, but is not limited to, hard drives, floppy diskettes, optical disks, CD-ROMs, DVD-ROMs, ROMS, RAMs, EPROMS, EEPROMS, magnetic or optical cards, solid-state memory devices, or other types of media/machine-readable medium suitable for storing electronic instructions.

Several aspects of the embodiments described will be illustrated as software modules or components. As used herein, a software module or component may include any type of computer instruction or computer executable code located within a memory device and/or transmitted as electronic signals over a system bus or wired or wireless network. A software module may, for instance, comprise one or more physical or logical blocks of computer instructions, which may be organized as a routine, program, object, component, data structure, etc., that performs one or more tasks or implements particular abstract data types.

In certain embodiments, a particular software module may comprise disparate instructions stored in different locations of a memory device, which together implement the described functionality of the module. Indeed, a module may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules may be located in local and/or remote memory storage devices. In addition, data being tied or rendered together in a database record may be resident in the same memory device, or across several memory devices, and may be linked together in fields of a record in a database across a network.

Figure 1:
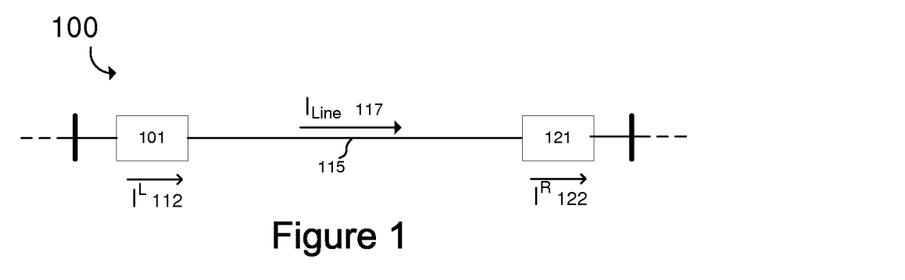
FIG. 1 is a block diagram of one embodiment of a segment of an electrical power transmission system.

Turning now to FIG. 1, a block diagram is depicted of a segment 100 of an electrical power transmission system comprising two terminals 101 and 121. In the FIG. 1 embodiment, a current $I_{Line}$ 117 may flow between terminal one 101 and terminal two 121. The current entering terminal one 101 may be denoted $I^L$ 112, and the current exiting terminal two 121 may be denoted $I^R$ 122. The designated currents, $I_{Line}$, $I^L$, and $I^R$, may flow over an electrical transmission line 115 which may comprise any electrical conductor and/or transmitter known in the art.

Current $I_{Line}$ 117 may be a set of three phase currents, namely A-phase ($I_A$), B-phase ($I_B$), and C-phase ($I_C$) currents, each having a sine wave signal with substantially the same magnitude 'r' and a phase offset of substantially 120° or ⅔ π between each phase during balanced operating conditions.

The phase components of the current $I^L$ 112 may be expressed as shown in Equations 1.1-1.4, where f may represent the frequency of the current signal, t may represent time, and $I_0$ may represent a zero-sequence current, a symmetrical component of three-phase current:

$I_A^L$ may be expressed as $r \cdot \sin(2\pi f t)$      Eq. 1.1

$I_B^L$ may be expressed as $r \cdot \sin\left(2\pi f t + \frac{2}{3}\pi\right)$,      Eq. 1.2 and $I_C^L$ may be expressed as $r \cdot \sin\left(2\pi f t + \frac{4}{3}\pi\right)$      Eq. 1.3

$I_0 = I_A^L + I_B^L + I_C^L$      Eq. 1.4

Each of the currents $I_A^L$, $I_B^L$ and $I_C^L$ may alternatively be expressed in phasor notation. Phasor notation comprises a magnitude and phase offset. Accordingly, the currents $I_A^L$, $I_B^L$, and $I_C^L$ of line current $I^L$ 117 may be expressed as shown in Equations 1.5-1.7:

$I_A^L$ may be expressed as $r\angle 0$      Eq. 1.5

$I_B^L$ may be expressed as $r\angle\frac{2}{3}\pi$ or $r\angle 120$      Eq. 1.6

$I_C^L$ may be expressed as $r\angle\frac{4}{3}\pi$ or $r\angle 240$      Eq. 1.7

The electrical power system segment 100 may comprise a current $I^L$ 112 entering terminal one 101 and a current $I^R$ 122 exiting terminal two 121 via power transmission line 115. In detecting fault conditions on transmission line 115, it may be advantageous to analyze current entering and exiting the power system segment 100 as a complex ratio of $I^R$ 122 (the current exiting power system segment 100) and $I^L$ 112 (the current entering power system segment 100).

Figure 2:
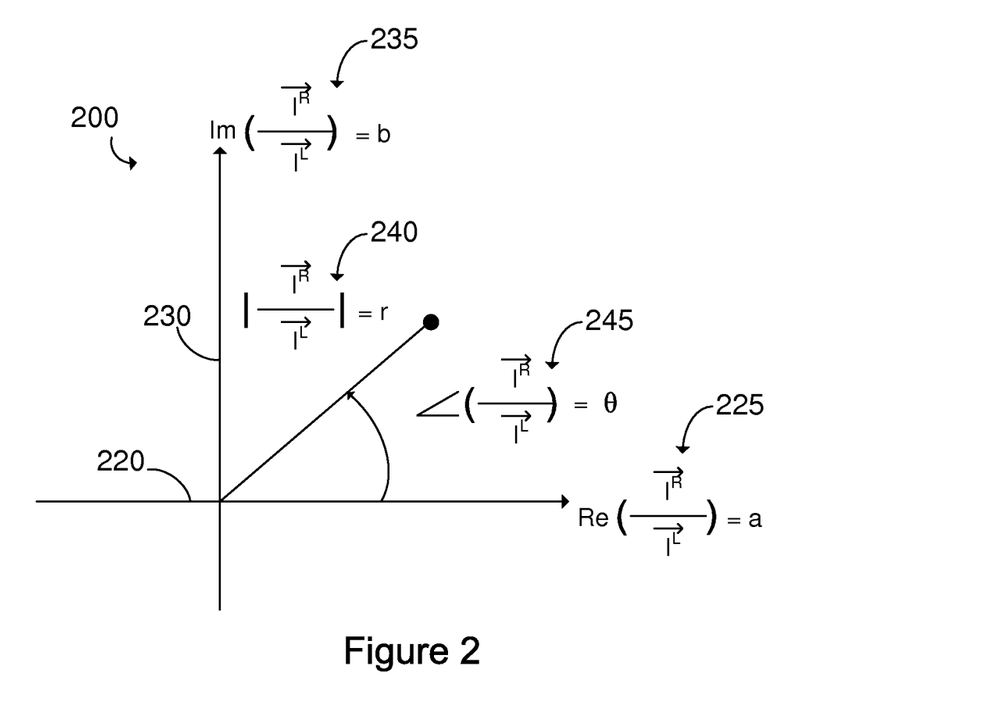
FIG. 2 depicts one embodiment of an α-plane defined by a ratio current entering a power system segment, $I^R$, to current exiting the segment, $I^L$.

Referring now to FIG. 2, an α-plane 200 defined by a ratio of current $I^R$ exiting an electrical power system segment and $I^L$ entering the electrical power system segment is shown. The α-plane 200 may comprise an 'a' axis 220 and 'b' axis 230. The 'a' axis 220 may comprise the real portion of the complex ratio $$\frac{I^R}{I^L}$$

as shown in Equation 1.8 and FIG. 2, element 225.

$a = \text{Re}\left(\frac{I^R}{I^L}\right)$      Eq. 1.8

The α-plane 200 may comprise a 'b' axis 230 comprising the complex portion of the complex ratio $$\frac{I^R}{I^L}$$

as shown in Equation 1.9 and FIG. 2, element 235.

$b = \text{Im}\left(\frac{I^L}{I^R}\right)$      Eq. 1.9

A point may be mapped to the α-plane 200 by calculating its magnitude 'r' and angle offset θ as shown in Equations 2.0 and 2.1 and FIG. 2 elements 240 and 245, respectively.

$r = \left|\frac{I^R}{I^L}\right|$      Eq. 2.0

$\theta = \angle\left(\frac{I^R}{I^L}\right)$      Eq. 2.1

Referring again to FIG. 1, on an ideal transmission line, neglecting line-charging current, in a through-load condition, the magnitude of $I^L$ 112 entering the power system segment and $I^R$ 122 exiting the power system segment are equal. However, $I^L$ 112 and $I^R$ 122 may be out of phase by 180° or π radians. Accordingly, the complex ratio of $I^R$ 122 over $I^L$ 112 may be −1 as shown in Eq. 2.2.

$\left(\frac{I^R}{I^L}\right) = 1\angle 180° = -1$      Eq. 2.2

This point may correspond to [−1, 0] on the α-plane 200. As discussed above, $I^L$ 112 and $I^R$ 122 may be comprised of three separate phase currents $I_A^L$, $I_B^L$ and $I_C^L$ and $I_A^R$, $I_B^R$ and $I_C^R$, respectively. The relationship of Equation 2.2 may apply to each component of $I^L$ 112 and $I^R$ 122.

Figure 3:
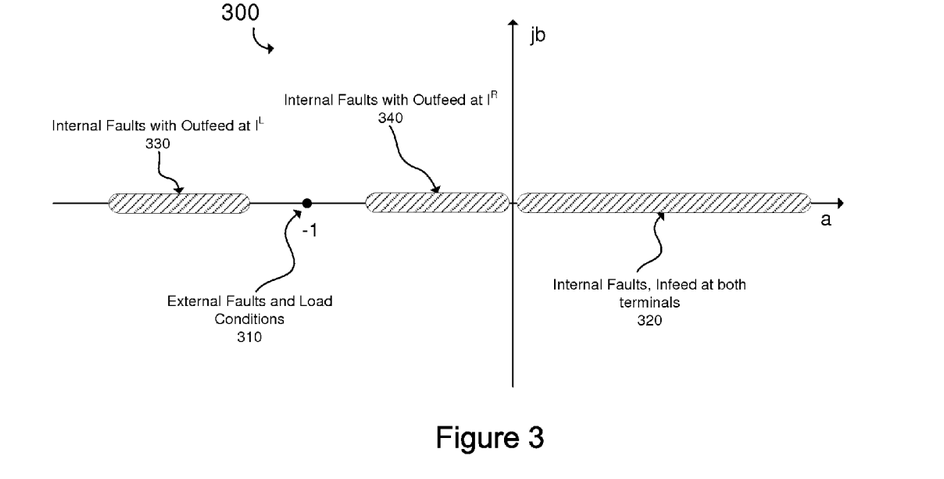
FIG. 3 depicts one embodiment of an α-plane having a nominal, load condition region and fault regions.

Turning now to FIG. 3, one embodiment of an α-plane 300 having points overlaid thereon is depicted. Point 310 may correspond to the condition of Equation 2.2 where current $I^L$ entering a power system segment and $I^R$ the current exiting the segment are substantially equal in magnitude, and out of phase by 180° or π radians. Point 310 (and equation 2.2) may correspond to a nominal, load, and/or no-fault condition of an electrical power transmission system segment.

Faults occurring within the power system segment (along transmission line 115 of FIG. 1) may be referred to as "internal faults" and may be represented on α-plane 300. Points in the α-plane diverging from [−1, 0] may represent such a fault condition on the power system segment. For example, an internal fault with infeed current at both line terminals may fall in a range defined by [a>0, b] on α-plane 300. Accordingly, such internal faults may be detected by points falling within region 320 of FIG. 3. Internal faults with outfeed at the left terminal ($I^L$ 112 in FIG. 1), may fall in a range of [a<−1, b] as shown in region 330 of FIG. 3. Internal faults with outfeed at the right terminal ($I^R$ 122 in FIG. 1) may fall within the range [−1<a<0, b] as shown in region 340 of FIG. 3.

Figure 4:
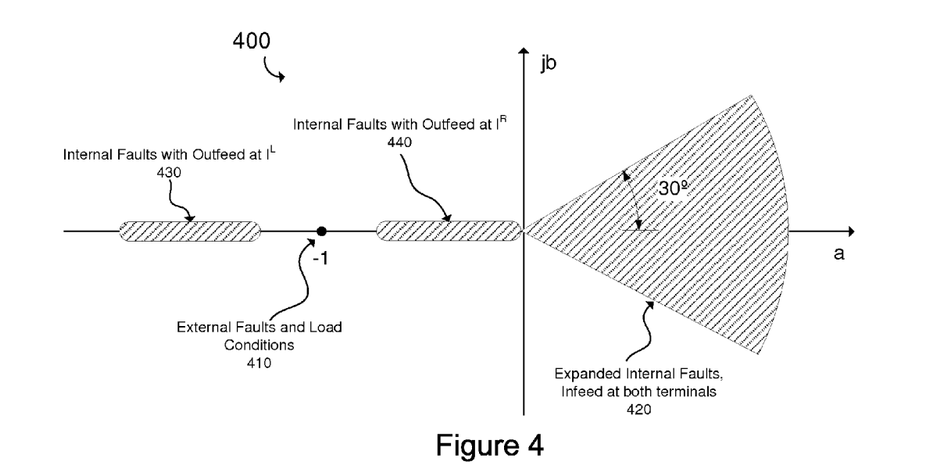
FIG. 4 depicts one embodiment of an α-plane having an expanded fault region.

Turning now to FIG. 4, an α-plane 400 having a modified internal fault with infeed current at both line terminals ($I^L$ and $I^R$) is depicted. In the event of a fault in the transmission line, the angles of the phase currents $I^L$ and $I^R$ may diverge from their ideal operating condition—the equal magnitude and 180° out-of-phase state of Equation 2.2. As discussed above, such faults may be mapped to a region in the α-plane along the a axis at points having a>0. However, for internal faults, the angles of the phase currents $I^L$ and $I^R$ may depend on the angles of the corresponding source voltages and on the angles of the impedances from the corresponding source to the fault point. As such, the currents ($I^L$ and $I^R$) at both line ends may not be in phase for an internal fault. The internal fault region 420 corresponding to infeed current $I^L$, $I^R$ at both power system segment terminals may be expanded to allow for this phase difference. In one embodiment, internal fault region 420 may be expanded by 30° or ⅙ π radians to account for this possible phase difference. In the FIG. 4 embodiment, the fault regions for internal faults 430 and 440 and nominal/load condition region 410 may not be affected.

Figure 5A:
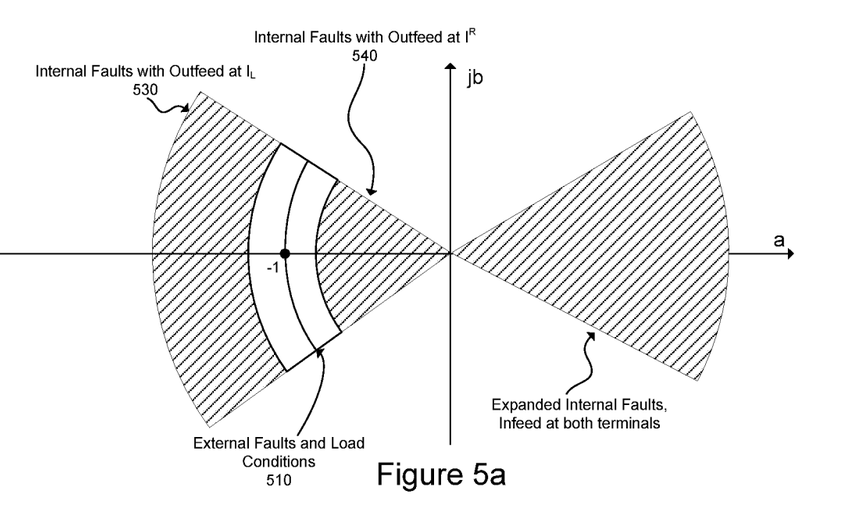
FIG. 5a depicts one embodiment of an α-plane having expanded fault and nominal, load condition regions.
Figure 5B:
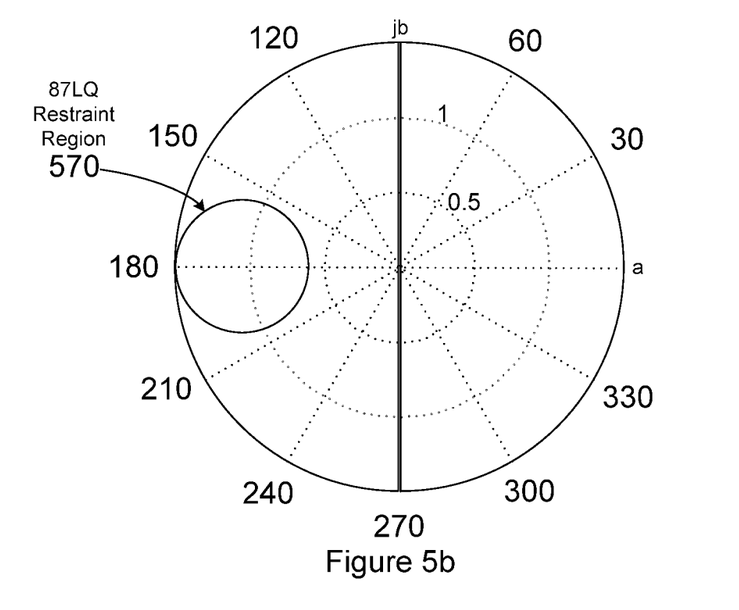
FIG. 5b depicts another embodiment of an α-plane having a restraint region.

Turning now to FIG. 5a, an α-plane having expanded nominal, load condition region 510 and outfeed internal fault regions 530, 540 is depicted. Detecting faults within a power system segment may require phase current readings from both sides or ends of the segment. Referring back to FIG. 1, such current readings could be performed at terminal one 101 and terminal two 121. The current readings made at terminal one 101 may be transmitted to terminal two 121 where they may be compared to current readings of terminal two 121. Similarly, the phase current readings acquired at terminal two 121 may be transmitted to terminal one 101 where they may be compared to the current readings of terminal one 101. Such comparison may be performed as part of a protective system comprising both terminals 101 and 121. The protective system may include various monitoring devices, control devices, metering devices, and protective devices (e.g., protective relays). In most cases, these devices are microprocessor-based or "intelligent" electronic devices (IEDs), such as protective relays, communications processors, phasor measurement units, digital fault recorders, and the like.

An asymmetrical and/or variable communication delay may be introduced into the system as the readings are communicated between IED terminals. As such, the readings obtained at terminal one 101 and transmitted to terminal two may be offset in time from the comparison readings obtained at terminal two. The offset in time may create a phase offset between the current signals. The phase offset may be proportional to the frequency of the signal measured as shown in Equations 2.3 and 2.4

$$I_A^L = r \cdot \sin(2\pi f t + \theta) \quad \text{Eq. 2.3}$$

$$I_A^L = r \cdot \sin(2\pi f t + \theta + 2\pi f \tau) \quad \text{Eq. 2.4}$$

In Equation 2.3, t may represent time and f may represent the frequency of the A-phase current of three-phase current $I_A^L$. Theta, θ may be the phase of the A-phase current. Equation 2.4 may represent a measurement of $I^L$ transmitted over a communications channel having a delay 'τ.' As discussed above, the delay τ may introduce a phase error into the measurement that may be proportional to the frequency of the measured current $I^L$.

Although various techniques have been employed to reduce and/or compensate for the delay τ in the communications channel, such techniques are not completely effective and some unaccounted-for delay may remain. For example, a "ping-pong" technique may be used to estimate the communications delay between terminals. In this technique, the roundtrip communications delay is measured, and the corresponding one-way communications delay is estimated as ½ the total roundtrip delay. However, this technique is not effective in systems having an asymmetrical and/or variable communications delay since the one-way delay may not consistently be ½ the total delay. For example, Synchronous Optical Networking (SONET) systems in common use may introduce an asymmetrical communication delay. As such, the one-way estimate may not be accurate. In addition, communications systems having variable routing channels, such as Internet Protocol (IP) routing and/or systems transmitting other communications traffic, may be subject to variable communications delays that are impossible to determine and/or predict.

The asymmetrical and/or variable delay δ in communication may introduce an error into the fault detection scheme. The effect of this error may be to rotate the current ratio about the origin of the α-plane. For example, a 1 millisecond error may rotate the current ratio 21.6° in an electrical power system operating at 60 Hz (i.e., the frequency of the current and/or voltage signals transmitted on the line is 60 Hz).

The communications delay error may require expansion of the nominal, load condition region 510. This expansion may be required to avoid registering misoperations caused by the communications delay. Region 510 shows one embodiment of an expansion of region 510 due to the communications delay.

FIG. 5 shows that the outfeed fault regions 530 and 540 may be similarly affected. For example, internal fault region having outfeed current at $I^L$ may be expanded as shown in region 530, and internal fault region having outfeed current at $I^R$ may be expanded as shown in region 540.

Due to the expanded regions 510, 530, and 540, detecting a fault in a system having asymmetrical and/or variable communications delay using current measurements only may be ineffective, or impossible. This may preclude the use of a number of simple and effective fault detection techniques, including, but not limited to, current differential characteristics analysis, including negative-sequence current amplitude comparison.

Differential current comparison elements, such as negative-sequence current comparison, may detect a fault in a power transmission segment using current measurements. Current measurements may be in the form of current data, symmetrical component (positive-sequence current, negative-sequence current, and/or zero-sequence current) alpha-clarke components, and the like. This is in contrast to other more complex techniques requiring additional measurements, such as phase voltage. Despite their increased complexity, these other methods may not be as effective as properly synchronized negative-sequence current amplitude comparison in detecting high impedance faults in the power system segment.

A current differential comparison element may compare an operating current value (also referred to as the differential current) with a restraint current value. The operating current, $I^{OP}$ may be the magnitude of the phasor sum of the currents entering the protected power system segment as shown in Equation 2.5:

$$I^{OP} = |I^L + I^R| \quad \text{Eq. 2.5}$$

$I^{OP}$ may be proportional to the fault current for internal faults and may approach zero for nominal and/or load conditions (e.g., point [−1, 0] on the α-plane of FIGS. 2-5).

The restraint current $I^{RT}$ may be obtained in a number of different ways, including, those shown in Equation 2.6(a)-2.6(d)

$$I^{RT} = k|I^L - I^R| \quad \text{Eq. 2.6(a)}$$

$$I^{RT} = k(|I^L| + |I^R|) \quad \text{Eq. 2.6(b)}$$

$$I^{RT} = \text{Max}(|I^L|, |I^R|) \quad \text{Eq. 2.6(c)}$$

$$I^{RT} = \sqrt{|I^L| \cdot |I^R|} \cos\theta \quad \text{Eq. 2.6(d)}$$

In Equations 2.6(a)-2.6(b) k may be a constant coefficient usually between 1 and 0.5, and θ may be the phase angle between $I^L$ and $I^R$.

In a two-terminal power transmission segment, such as that shown in FIG. 1, the operating and restraint currents $I^{OP}$ and $I^{RT}$ may be calculated using Equations 2.5 and 2.6(b), respectively. In this case, $I^L$ and $I^R$ may be the line currents at terminal one 112 and terminal two 122.

An operating condition of the power segment may be defined by the inequality of Equations 2.7 and 2.8

K may be a constant coefficient representing the slope of the relay characteristic, and $K_0 * I_{NOM}$ may be the minimum pickup current. The value used for $K_0$ may determine a sensitivity of the differential element. Accordingly, the operating condition may be as shown in Equations 2.7 and 2.8:

$$I^{OP} > K I^{RT} \qquad \text{Eq. 2.7}$$

$$I^{OP} > K_0 I_{NOM} \qquad \text{Eq. 2.8}$$

The operational conditions of Equations 2.7 and 2.8 may be mapped into the α-plane of FIGS. 2-5b. This mapping shows that the operational characteristics defined by Equations 2.7 and 2.8 may be affected by asynchronous and/or variable communications delay between IEDs.

The use of negative sequence component analysis may improve the performance of the operational condition equations 2.7 and 2.8. For example, applying negative sequence component currents to equations 2.7 and 2.8 may reduce the effects of standing current unbalance previous to the fault.

A negative sequence component of a three-phase signal may be calculated from the set of three phase currents. As discussed above, a three-phase electrical signal used in an electrical power transmission system (e.g., $I^L$ and $I^R$ of FIG. 1) may be comprised of three sinusoidal voltage/current signals having a substantially equal magnitudes with a phase offset of substantially 120° or $$\frac{2}{3}\pi.$$

Turning now to FIG. 5a, an α-plane having a restraint region 570 corresponding to Equations 2.5, 2.6 and/or variations thereof is depicted. Since the restraint characterization equations may comprise time stamped measurements, restraint region 570 may not be affected by asynchronous and/or variable communication delays.

However, fault conditions in the power transmission system may create an unbalanced condition between phases. Symmetrical component analysis may be used to analyze and detect such conditions. Under symmetrical component analysis, an unsymmetrical set of three phasors (such as an unbalanced three-phase power system) may be represented as three symmetrical component sets: a zero sequence set, a positive sequence set, and a negative sequence set. These sets may be denoted as '0' for the zero sequence, '1' for the positive sequence, and '2' for the negative sequence.

The symmetrical components may be formed by applying a transform to the three-phase system. For instance, the transformation matrix shown in Equation 3.0 may be applied to a three-phase system to determine symmetrical components '0,' '1,' and '2' from a three-phase current comprised of phase currents $I^A$, $I^B$ and $I^C$. In equation 3.0, α may be a constant value $1\angle 120°$ corresponding to the phase offset between phase currents $I^A$, $I^B$ and $I^C$.

$$\begin{bmatrix} I_0 \\ I_1 \\ I_2 \end{bmatrix} = \frac{1}{3} \begin{bmatrix} 1 & 1 & 1 \\ 1 & \alpha & \alpha^2 \\ 1 & \alpha^2 & \alpha \end{bmatrix} \begin{bmatrix} I^A \\ I^B \\ I^C \end{bmatrix} \qquad \text{Eq. 3.0}$$

From Equation 3.0, a negative sequence current $I_2$ may be calculated as shown in Equation 3.1:

$$I_2 = \frac{1}{3}(I^A + \alpha^2 I^B + \alpha I^C) \qquad \text{Eq. 3.1}$$

The negative phase current of Equation 3.1 may be applied to the operating and scaled restraint current inequality of Equations 2.7 and 2.8. Using negative phase current in this way may eliminate the errors introduced into the system by standing current unbalance.

Mapping negative sequence current values into 2.7 and 2.8 may yield operating conditions expressed as Equations 3.2(a) and 3.2(b):

$$I_2^{OP} > K I_2^{RT} \qquad \text{Eq. 3.2(a)}$$

$$I_2^{OP} > K_0 I_{NOM} \qquad \text{Eq. 3.2(b)}$$

Values for $I_2^{OP}$ and $I_2^{RT}$ may be obtained from a set of three-phase currents $I^L$ and $I^R$ using Equations 2.5, one of 2.6(a) through 2.6(d) as shown in Equations 3.3(a) through 3.3(e), and Equation 3.1:

$$I_2^{OP} = |I_2^L + I_2^R| \qquad \text{Eq 3.3(a)}$$

$$I_2^{RT} = k|I_2^L - I_2^R| \qquad \text{Eq. 3.3(b)}$$

$$I_2^{RT} = k(|I_2^L| + |I_2^R|) \qquad \text{Eq. 3.3(c)}$$

$$I_2^{RT} = \text{Max}(|I_2^L|, |I_2^R|) \qquad \text{Eq. 3.3(d)}$$

Another fault detection scheme may compare the angle of current $I^L$ entering the power system segment to the angle of the current $I^R$ exiting the segment. A fault may be detected according to Equation 3.4:

$$Re[I_2^L \cdot (I_2^R)^*] > 0 \qquad \text{Eq. 3.4}$$

In Equation 3.4, $I_2^L$ may represent a local negative-sequence current phasor and $I_2^R$ may represent a negative-sequence current phasor obtained at a remote relay. A fault may be detected if the real component of the product of local negative-sequence phase current and the complex conjugate of remote negative-sequence current is greater than zero.

However, as discussed above, asynchronous and/or variable communications delay between terminal IEDs may preclude the use of Equations 3.2, 3.3, and 3.4 in practice. This is because, as shown in FIGS. 2-5, the asynchronous and/or variable communications delay between local and remote IEDs may introduce significant error into Equations 3.2, 3.3, and 3.4. As discussed above, this error may be visualized via the α-plane rotations of FIGS. 3-5b.

Time-stamped, phase current measurements may allow a protection system to compensate for this communications channel delay. This may allow the relatively simple and effective operational Equations 3.2, 3.3, and 3.4 to be used in practice. This may be advantageous since Equations 3.2, 3.3, and 3.4 may detect power system faults using only phase current measurements (as opposed to systems requiring phase current and phase voltage measurements) and may be computationally less complex than other detection methods, allowing the system to be more reliable and economical as compared with the systems relying on more complex phase current/voltage relationships.

Figure 6:
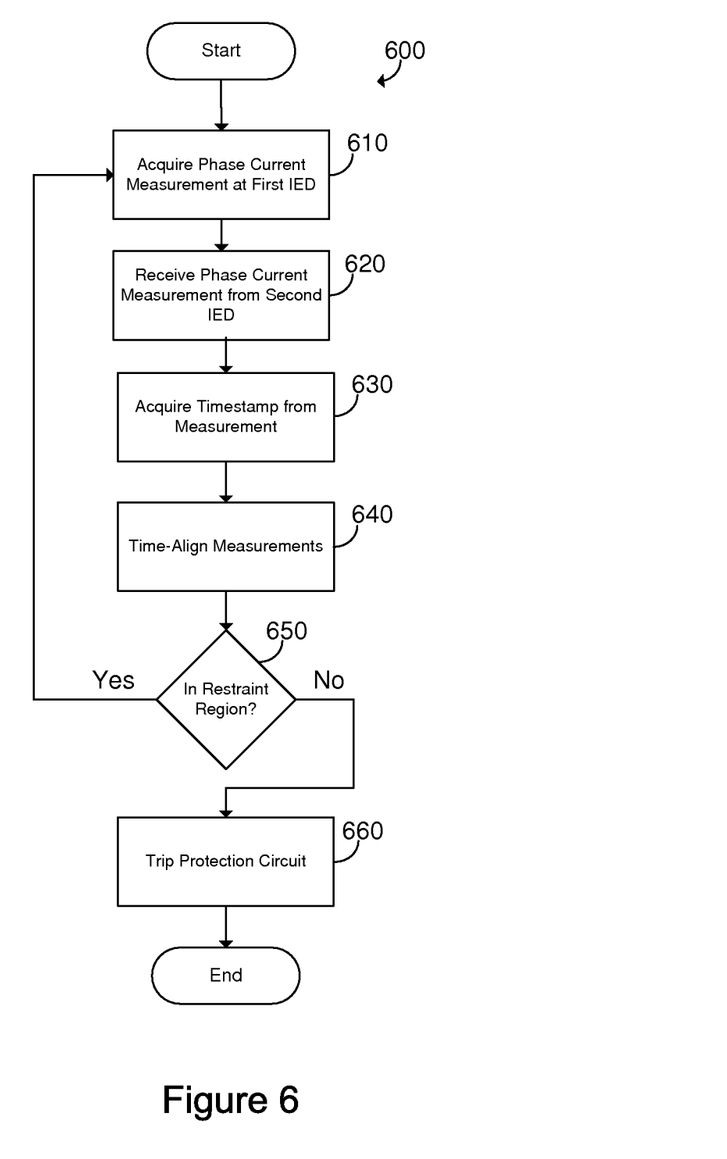
FIG. 6 is a flow diagram of one embodiment of a method to detect faults in an electrical power transmission system.

Turning now to FIG. 6, one embodiment of a process flow diagram 600 for detecting a fault within a power system segment defined by a first IED and second IED at the first IED is depicted.

At step 610 a phase current measurement at a first IED may be obtained. The first IED may be configured to obtain phase current measurements periodically. Since the phase current measurement of step 610 may be obtained locally at the first IED, there may be little or no delay in communicating the measurement to process 600. However, any such delay may be measurable and/or relatively constant such to allow process 600 to compensate for it.

At step 620, a phase current measurement from a second, remote, IED may be received at the first IED. The measurement of step 620 may have been transmitted over a communications interface, such as a SONET network, and IP network, or the like. As discussed above, the communication interface may introduce an asynchronous and/or variable communications delay into process 600 such that it may be impossible to determine when the measurement of step 620 was obtained and/or transmitted.

At step 630, a timestamp associated with the measurement of step 620 may be acquired. The timestamp may be included in the message received at 620 or may be received in a separate message. The timestamp may allow process 600 to determine the time the current phase measurement of step 620 was obtained at the second IED.

At step 640, the phase current measurement obtained at step 620 may be time-aligned with the current phase measurement of step 610. As used herein, time alignment may refer to modifying the phase and/or magnitude of phase current measurements of steps 610 and 620. Additionally, time alignment may refer to delaying one of the measurements of steps 610 and/or 620 relative to the other.

Figure 8:
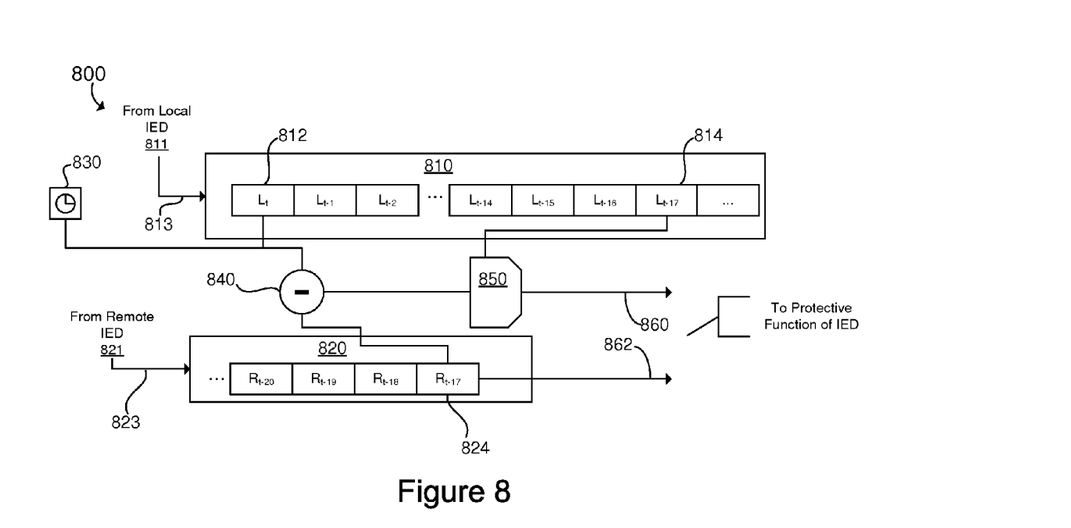
FIG. 8 depicts one embodiment of a time alignment system.

Time alignment may comprise delaying a locally obtained measurement relative to a remote measurement. In this case, each measurement may be time-stamped relative to a common time reference standard (i.e., a time standard shared by the local and remote IEDs). The common time reference can be any time reference shared by the local and remote relays, such as, for example, an absolute time that can be provided by a global positioning system (GPS); a common time provided by a GPS; NIST time signals carried on radio waves, such as, for example, WWV or WWVB; common time provided by a high-accuracy clock, such as, for example, a cesium clock or atomic clock, and the like. The time alignment may comprise delaying and/or buffering a phase current measurement to align measurements having the same timestamp. One embodiment of such an alignment technique is depicted in FIG. 8.

Time alignment may comprise modifying a phase and/or magnitude of the phase current measurements of 610 and/or 620 to conform to a common time reference. In this embodiment, the measurements of 610 and 620 may comprise a synchrophasor according to the teachings of United States Patent Application Pub. No. 2007/0086134, entitled "Apparatus and Method for Estimating Synchronized Phasors at Predetermined Times Referenced to an Absolute Time Standard in an Electrical System" to Zweigle et al., which is herein incorporated in its entirety. In this embodiment, phase current measurements may be made according to a common time reference. The phase angle and/or magnitude of the measurements may be modified to conform to a sampling time defined on the common time reference. As such, time alignment may comprise generating synchrophasor measurements at step 610, 620 and time aligning the measurements as described in Zweigle et al.

In another embodiment, the measurements of the first and second IEDs may be obtained according to a measurement interval defined on a common time reference. Each phase current measurement may comprise a reference to a measurement sequence number and/or a measurement offset from the measurement interval. As such, time alignment may comprise matching current measurements having the same measurement interval sequence number and/or offset. Such matching may comprise buffering the phase current measurement and/or referencing the phase current measurements in a random or sequential access memory storage location. In another embodiment, symmetrical components of the measured currents (such as a negative-sequence) may be sent directly instead of the separate current measurements being sent.

At step 650, process 600 may determine whether the system is operating in a restraint region indicating nonminal and/or a no-fault operating condition. The operating condition may correspond to Equations 2.7 and 2.8 using phase current measurement, 3.2 and 3.3 using negative sequence phase currents, and/or Equation 3.4 as described above. The phase current measurement of step 610 and 620 may be in analog or digital format. If in digital format, step 640 may be performed in a digital processor, such as a general purpose processor, an application specific integrated circuit (ASIC), ROM, field programmable gate array (FPGA), or the like. Measurements in analog form may be converted to digital using an analog to digital converter (AD), or, alternatively, may be processed in their analog form using an analog comparator.

If the operating conditions are not satisfied, the flow may continue to step 610 where process 600 may continue monitoring the system. Otherwise, the flow may continue to step 660.

At step 660, process 600 may assert a trip signal indicating that a fault condition has been detected on the power system segment between the first and second IEDs. Additional actions may be taken at 660 including, but not limited to, disconnecting the power system segment from the rest of the power network, taking protective actions to prevent damage to the first and second IEDs, and the like.

Figure 7:
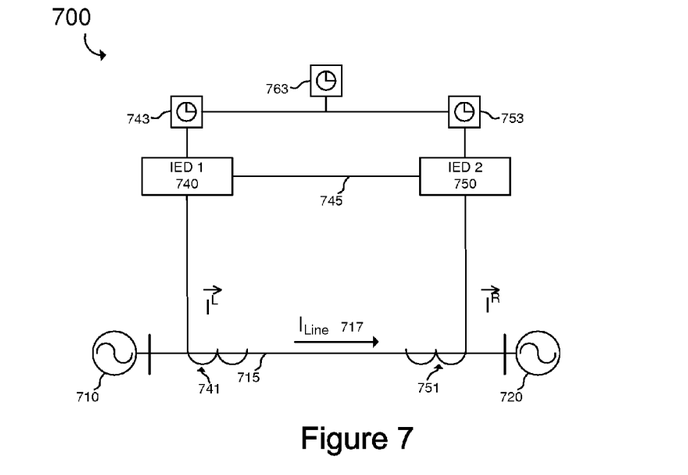
FIG. 7 is a block diagram of one embodiment of an electrical transmission system segment defined by first and second intelligent electronic devices (IEDs)

Turning now to FIG. 7, one embodiment of a power system segment 700 defined by a first IED 740 and second IED 750 is depicted. A power transmission medium 715 may allow a current $I_{Line}$ 717 to flow within the segment defined by IEDs 740, 750. The current $I_{Line}$ 717 may be driven by a source 710 and consumed and/or transmitted by a load/transmitter 720. As discussed above, current $I_{Line}$ 717 may comprise a three-phase current/voltage signal.

IED one 740 may be communicatively coupled to a current sensor 741. Current sensor 741 may obtain phase current measurements corresponding to a current $I^L$ entering segment 715. Current sensor 741 may be a current transformer 741 coupled to power transmission medium 715. IED two 750 may be communicatively coupled to current sensor 751. Current sensor 751 may obtain phase current corresponding to a current $I^R$ exiting segment 715. Current sensor 751 may be a a current transformer 751 coupled to power transmission medium 715. As discussed above, the current measurements obtained by 741, 751 may comprise a set of three-phase currents 717, and/or a symmetrical component of the set of three phase currents 717 (e.g., a negative sequence of current 717).

IED one 740 may be configured to transmit phase current measurements obtained by sensor 741 to IED two 750 via communications channel 745. Communications channel 745 may comprise any communications transmission system known in the art including, but not limited to: an IP network, a SONET network, a wireless network, a radio network, a cellular network, or the like.

The measurements from IED one 740 to IED two 750 may comprise a timestamp generated by clock 743. Clock 743 may be in communication to a common time reference signal source 763. Common time reference source 763 may allow clock 743 of IED one 740 to be synchronized with clock 753 of IED two 750. The timestamp may be generated in any form known in the art, including a Universal Coordinated Timestamp (UTC), Unix timestamp, an offset time, or the like. Alternatively, IED one 740 may be configured to conform its measurement time and/or the phase and/or magnitude of phase current measurements to a measurement time determined by clock 743.

In a similar embodiment, the common time signal reference may be provided by one of the IEDs. For example, IED one 740 may include a clock 743 that generates a common time reference signal to IED two 750. In this embodiment, the clock 743 may comprise a high-accuracy clock, such as a cesium clock. In this embodiment, interruption of communication with the common time reference source 763 would not affect the accuracy of the time stamps applied by IEDs one or two 740, 750.

Similarly, IED two 750 may be configured to transmit phase current measurements obtained via sensor 751 to IED one 740 via communications channel 745. IED two 750 may be configured to include a timestamp with the measurements transmitted to IED one 740 using clock 753 coordinated to common time reference 763. Alternatively, IED two 750 may be configured to conform its measurement time and/or the phase and/or magnitude of phase current measurements to a measurement time determined by clock 753.

Since the current measurements transmitted between IED one 740 and IED two 750 may comprise a timestamp corresponding to a common time reference 763, IED one 740 may be able to time align current measurements received from IED two 750 over communications channel 745 and vice versa. This may allow IED one 740 and IED two 750 to use a negative sequence current amplitude comparator protection function to detect faults internal to power system segment 700 on power transmission line 715.

Turning now to FIG. 8, one embodiment of system 800 for time aligning phase current measurements made on a local IED with measurements transmitted from a remote IED is depicted. Phase current measurements made locally may be received by time alignment system 800 via connection 811. As discussed above, the phase current measurement 813 received on connection 811 may comprise a set of three phase current measurements, a single phase of a set of three phase current measurements, and/or a component of a symmetrical component derived from a three-phase current set (e.g., negative sequence current measurement). The local current measurement 813 received via connection 811 may comprise a timestamp referenced to a common time reference.

The local current measurement 813 received on connection 811 may be stored in memory storage 810. Memory storage 810 may comprise a random access memory, shift register, first-in-first-out (FIFO) or any other data storage and/or buffering mechanism known in the art. In the embodiment of FIG. 8, the memory storage comprises a random access FIFO.

Local phase current measurements may be stored in memory storage 810 in the order they were obtained. For example, a measurement obtained at the current time t may be stored in memory storage location 812. Measurements occurring earlier in time may be shifted to the right within memory storage 810. For example, the memory storage location directly to the right of 812 may contain the proceeding measurement obtained at t-1. Memory storage location 810 may comprise as many memory storage locations as needed to time align local and remote phase current measurements. As such, if current measurements are obtained at a measurement frequency $f_s$, and the communications delay between the local and remote IED varies with a maximum delay of $\Delta$, memory storage 810 should accommodate for the local and remote samples according to $\Delta$.

System 800 may comprise a memory storage location 820 to buffer incoming current measurements 823 received from a remote IED (not shown). These remote current measurements 823 may have been obtained at a remote IED in communication with the local IED over a communications interface 821. Communications interface 821 may comprise any communications interface known in the art including, but not limited to: a SONET network, an IP network, a cellular network, a radio network, or the like. Since the remote current measurements 823 may be delayed relative to the local current measurements 813 of memory storage 810, no buffer 820 may be needed.

The current measurements obtained at the local IED may comprise a timestamp corresponding to a common time reference 830. Time standard 830 may allow the local and remote IED to generate synchronized timestamp information. In the embodiment of FIG. 8, time standard 830 may be used to timestamp local current measurement 813 as it is stored in memory storage 810.

Comparator 840 may determine a time differential between a local current measurement 813 stored in storage location 812 of memory storage 810 and a remote current measurement stored in storage location 824 of memory storage 820. For example, in the depiction of FIG. 8, the time differential is seventeen (17) measurement samples.

The output of comparator 840 may be passed to selector 850. Selector 850 may comprise a multiplexer, addressor, or any other component capable of determining an offset and/or address into memory storage 810 given a measurement offset calculated by comparator 840. In the example depicted in FIG. 8, selector may select the local current measurement stored in memory storage 814 having a measurement offset of seventeen (17).

The output 860 of selector 850 may be passed to a local protective function as a local current measurement, and the output 862 of memory storage 820 may be passed to a local protective function as a remote current measurement. The current measurements of 860 and 862 may be time aligned, allowing the protective function to operate properly.

Figure 9:
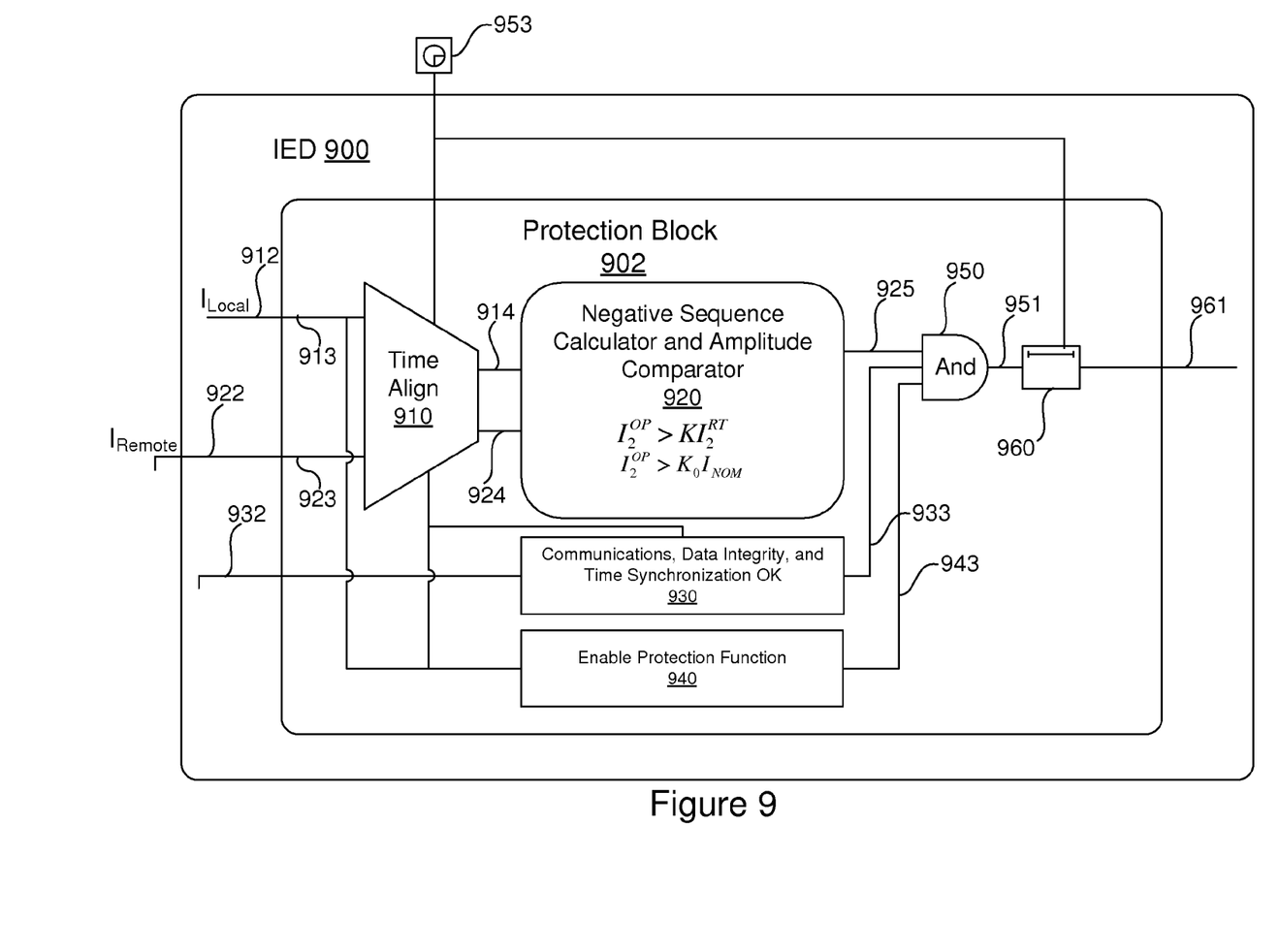
FIG. 9 depicts a block diagram of one embodiment of a protection system for an IED.

Turning now to FIG. 9, a block diagram of one embodiment of a protective IED 900 having a current amplitude comparator protection block 902 comprising a negative sequence calculator 920 according to the teachings of this disclosure is depicted. IED 900 may comprise current amplitude comparator protection block 902 as part of IED 900 in a power system segment. Current amplitude protection block 902 may be communicatively coupled to a local phase current sensor (not shown) of IED 900 to obtain a local current measurement 912 via a current transformer (not shown) coupled to power transmission media (not shown). Current amplitude protection block 902 may be communicatively coupled through IED 900 to a remote IED (not shown) through a communications interface 922 which may provide a remote phase current measurement 923 to protection block 902. As discussed above, local and remote current measurements may comprise set of phase current measurements, one or more phases of set of phase current measurements, and/or a symmetric component of a set of phase currents (e.g., a negative, positive, or zero component of a three-phase current).

A time alignment block 910 may be used to time align a phase current measurement 913 obtained at IED 900 via connection 912 with a remote phase current measurement 923 obtained via communications interface 922. As discussed above, the time alignment may comprise delaying the local phase current measurement 913 and/or remote phase current measurement 923 relative to the other. Alternatively, the time alignment may comprise modifying a phase and/or magnitude of the local 913 or remote 923 current measurements. The phase and/or magnitude of remote phase current measurement 923 may have been synchronized to a common time reference associated with clock 953. This synchronization may comprise modifying a phase and/or magnitude of the current measurement. Also as discussed above, the local 913 and remote 923 current measurements may comprise a timestamp and/or a reference to a measurement interval defined against a common time reference. In this embodiment, time alignment function 910 may use the timestamp, measurement interval, and/or measurement interval offset to time align the measurements. Similarly, the remote phase current measurement 923 and/or the local phase current measurement 913 may comprise a synchrophasor. In this embodiment, the time alignment mechanism may be that disclosed in Zweigle et al. The time alignment technique and/or methodology used by time alignment function 910 may use clock 953. Clock 953 may comprise and/or be synchronized to a common time reference. Clock 953 may be a separate component in communication with IED 900, as shown in FIG. 9, or may be an internal component of IED 900.

The output of the time alignment function 910 may comprise time aligned phase current measurements 914 and 924. As discussed above, the time aligned values for $I^L$ 914 and $I^R$ 924 may be used to derive an operating current $I^{OP}$ and restraint current $I^{RT}$. The operating and restraint current values may correspond to a three-phase current, a phase of a three-phase current, and/or a symmetric component of a three-phase current (e.g., negative, positive, and/or zero).

Negative sequence calculator and amplitude comparator 920 may apply Equations 2.7 and 2.8, Equations 3.2(a) and 3.2(b) (using equations 3.3(a) through 3.3(d)), and/or equivalents thereof to determine an operating condition of the power system segment. Accordingly, negative sequence calculator and amplitude comparator 920 may comprise and/or make use of a general purpose processor, an ASIC, FPGA, and/or any other digital processor capable of computing Equations 2.7, 2.8, Equations 3.2, 3.3 or derivatives thereof. Negative sequence calculator and amplitude comparator 920 may compare the amplitude of the operating current to a scaled restraint current and a scaled nominal current. In the FIG. 9 embodiment, if the amplitude of the negative sequence operating current $I_2^{OP}$ is greater than a scaled negative sequence restraint current $KI_2^{RT}$ and the scaled pick-up current $K_0 I_{NOM}$, the current amplitude protective function may assert output 925. Output 925 may indicate a fault in the power system segment.

The output 925 of negative sequence calculator and amplitude comparator 920 may flow to an input of three-input AND gate 950. Three-input AND gate 950 may also receive input from Communications, Data Integrity, and Time Synchronization OK functional block 930. Functional block 930 may determine whether the inputs to protection block 902 are valid. Functional block 930 may receive an input 932 from IED 900 indicating the status of a communications interface 922 used to receive remote current measurements. Functional block 930 may receive a data integrity check from the communications interface 922 used to communicate with the remote IED (not shown). Some communications interfaces comprise fault detection systems, such as message hash-values, check bits, and the like. Accordingly, the communications interface may detect communication errors thereon. These errors may be passed to functional block 930. Functional block 930 also may receive an input from time alignment function 910 and/or clock 953 to indicate the status of the time alignment system. For instance, an unexpected delay in the communications system may cause the time alignment function to fail (e.g., the delay is greater than the memory capacity of the time alignment system). If any of the communications integrity, data integrity, and/or time synchronization inputs indicate an error, functional block 930 may de-assert output 933 to nullify any fault detected by negative sequence calculator and amplitude comparator 920. This may prevent negative sequence calculator 920 from registering a fault condition based upon bad measurement and/or timing data. If each of the communications integrity, data integrity, and time synchronization inputs indicate nominal operation, functional block 930 may assert output 933 to enable the fault detection function output of negative sequence calculator 920.

AND gate 950 may receive an input 943 from enable current amplitude comparator protection function 940. Enable protection function 940 may be communicatively coupled to the outputs of time alignment block 910 such that symmetrical components of the local and remote samples can be computed and compared with a threshold to enable the protection function. Enable protection function 940 may further receive the local phase current measurement 913 obtained at IED 900 via connection 912. For example, the absolute values of the negative sequence components of the local and remote samples ($|I_2^L|$ and $|I_2^R|$, respectively) may be computed and cause the enable protection 940 to assert when $|I_2^L|$ and $|I_2^R|$ exceed the element sensitivity threshold and when the absolute value of the local negative sequence component $|I_2^L|$ is greater than a factor of the absolute value of local positive-sequence current $|I_1^L|$ (such as, for example, $0.05 \cdot |I_1^L|$). The element sensitivity threshold may be a factor of the absolute value of the nominal current. such as, for example, $0.05 \cdot |I_{NOM}|$. If the criteria are not met, output 943 may be de-asserted to nullify the other inputs to AND gate 950.

The output 951 of AND gate 950 may be asserted if all of the inputs 925, 933, and 943 are asserted. Output 951 of AND gate 950 may be passed to a security counter 960. Counter 960 may only assert its output 961 if its input 951 is asserted for a pre-determined number of samples and/or clock cycles. For example, counter 960 may only assert output 961 if the fault condition input 951 has been asserted for two (2) measurement samples and/or clock cycles. This may prevent so-called false element assertions due to glitching and/or temporary abnormalities on the power system segment.

Output 961 may indicate that negative sequence calculator 920 has detected a fault in the power system segment. Accordingly, output 961 may be communicatively coupled to a user interface of IED 900 and/or further protective functions to send a trip signal to trip the line breakers, alert a user, such as an engineer, of the fault and/or disconnect the power system segment from the rest of a power grid or otherwise protect the power system from the detected fault. In one embodiment, IED 900 may be communicatively coupled to a communications network (not shown). Upon detecting a fault via output 961 of protection block 902, IED 900 may transmit a message via the communications network to effect a trip, alert an engineer of the fault and/or remove the power system segment from the power system grid.

Figure 10:
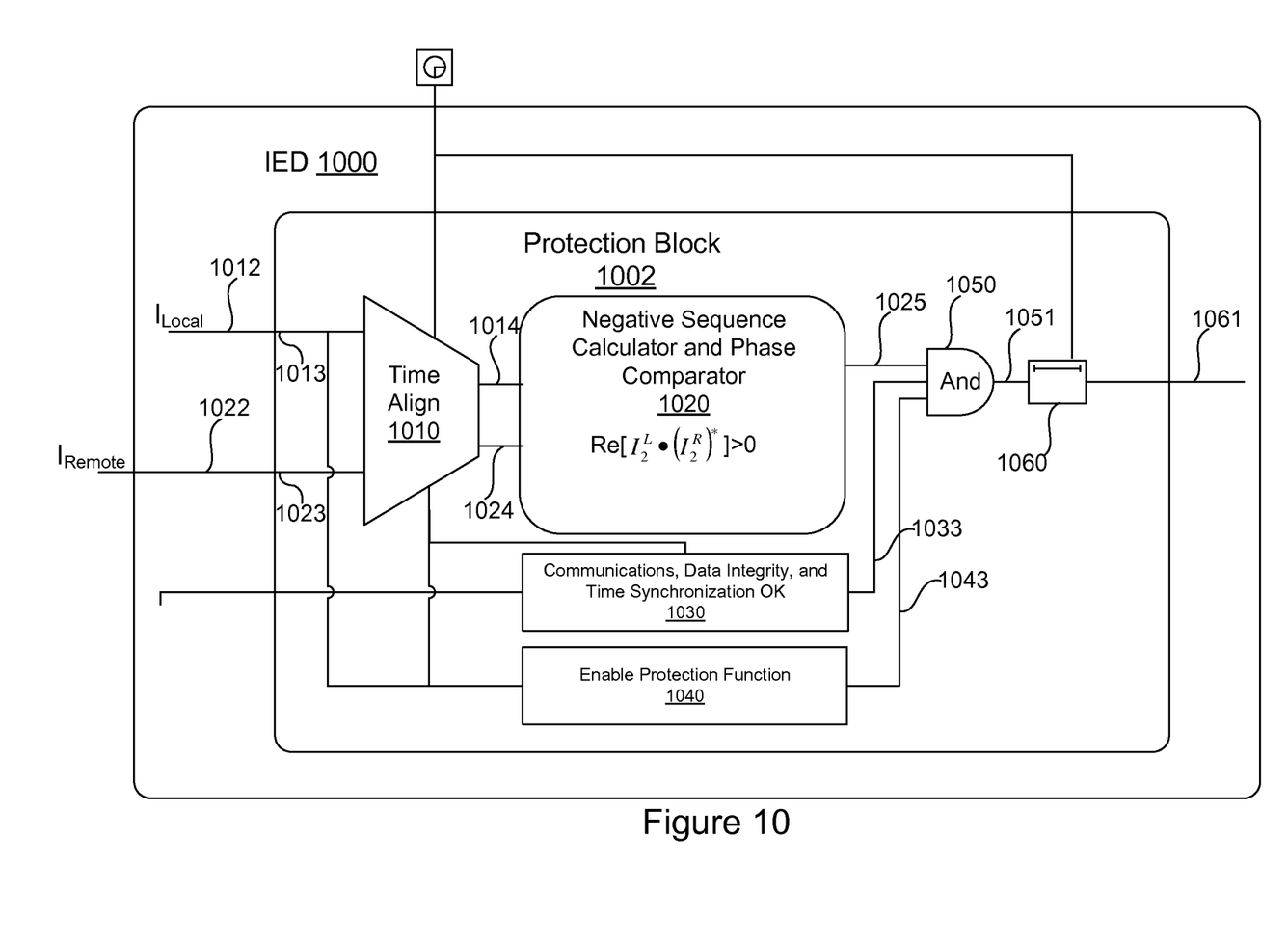
FIG. 10 depicts a block diagram of another embodiment of a protection system for an IED.

Turning now to FIG. 10, a block diagram of one embodiment of a protective IED 1000 having a protection block such as a negative sequence directional calculator and phase comparator 1002 according to the teachings of this disclosure is depicted. IED 1000 may comprise protection block 1002 as part of IED 1000 in a power system segment. Protection block 1002 may be communicatively coupled to a local phase current sensor (not shown) of IED 1000 to obtain a local current measurement 1012 through a current transformer (not shown) coupled to a power transmission media (not shown). Current amplitude protection block 1002 may be communicatively coupled through IED 1000 to a remote IED (not shown) through a communications interface 1022 which may provide a remote phase current measurement 1023 to protection block 1002. As discussed above, local and remote current measurements may comprise a set of phase current measurements, one or more phases of a set of phase current measurements, and/or a symmetric component of a set of phase currents (e.g., a negative, positive, or zero component of a set of three phase currents).

A time alignment block 1010 may be used to time align a phase current measurement 1013 obtained at IED 1000 via connection 1012 with a remote phase current measurement 1023 obtained via communications interface 1022. As discussed above, the time alignment may comprise any number of various time alignment techniques and/or methodologies including, but not limited to: delaying the phase current measurements, modifying a phase and/or magnitude to the phase current measurements, generating a timestamped phase current measurement, generating a synchrophasor, and the like.

The output of the time alignment function 1010 may comprise time aligned phase current measurements 1014 and 1024. As discussed above, the time aligned values for $I^L$ 1014 and $I^R$ 1024 may be used to derive negative, zero, and/or positive sequence components corresponding to the phase current values of the three-phase sets $I^L$ 1014 and $I^R$ 1024.

Negative sequence calculator and phase comparator 1020 may apply Equation 3.4 and/or an equivalent thereof (e.g., an equation like Eq. 3.4 utilizing phase current, zero sequence, and/or positive sequence values). Negative sequence calculator and phase comparator 1020 may apply Equation 3.4 to make a trip decision (i.e., detect a fault condition) is the real portion of the product of local negative sequence current and remote negative sequence current is greater than zero. When this condition exists (a greater than zero product is calculated at 1020), output 1025 may be asserted.

Negative sequence calculator and phase comparator 1020 may comprise and/or make use of a general purpose processor, an ASIC, FPGA, and/or any other digital processor capable of computing Equation 3.4 and/or a variant thereof.

The output 1025 of negative sequence calculator 1020 may flow to an input of three-input AND gate 1050. Three-input AND gate 1050 may also receive input from Communications, Data Integrity, and Time Synchronization OK functional block 1030. As described above, Functional block 1030 may determine whether the inputs to protection block 1002 are valid. If any of the communications integrity, data integrity, and/or time synchronization inputs indicate an error, functional block 1030 may de-assert output 1033 to nullify any fault detected by negative sequence calculator and phase comparator 1020. This may prevent the system from registering a fault condition based upon bad measurement and/or timing data. Otherwise, functional block 1030 may assert output 1033 to enable the fault detection function output of negative sequence calculator and phase comparator 1020.

AND gate 1050 may receive an input 1043 from enable protection function 1040. Enable protection function 1040 may be communicatively coupled to the outputs of time align block 1010 such that symmetrical components of the local and remote samples can be computed and compared with a threshold to enable the protection function. Enable protection function 1040 may further receive the local phase current measurement 1013 obtained at IED 1000 via connection 1012. For example, the absolute values of the negative sequence components of the local and remote samples ($|I_2^L|$ and $|I_2^R|$, respectively), may be computed and cause the enable protection 1040 to assert when $|I_2^L|$ and $|I_2^R|$ exceed the element sensitivity threshold and when the absolute value of the local negative sequence component $|I_2^L|$ is greater than a factor of the absolute value of local positive-sequence current $|I_1^L|$ (such as, for example, $0.05 \cdot |I_1^L|$). The element sensitivity threshold may be a factor of the absolute value of the nominal current such as, for example, $0.05 \cdot |I_{NOM}|$. If the criteria are not met, output 1043 may be de-asserted to nullify the other inputs to AND gate 1050.

The output 1051 of AND gate 1050 may be asserted if all of the inputs 1025, 1033, and 1043 are asserted. Output 1051 of AND gate 1050 may be passed to a security counter 1060. Counter 1060 may only assert its output 1061 if its input 1051 is asserted for a pre-determined number of samples and/or clock cycles. For example, counter 1060 may only assert output 1061 if the fault condition input 1051 has been asserted for two (2) consecutive measurement samples and/or clock cycles. This may prevent so-called false element assertions due to glitching and/or temporary abnormalities on the power system segment.

Output 1061 may indicate that negative sequence calculator and phase comparator 1020 has detected a fault in the power system segment. Accordingly, output 1061 may be communicatively coupled to a user interface of IED 1000 and/or further protective functions such as to send a trip signal resulting in tripping of a circuit breaker, to alert a user and/or disconnect the power system segment from the rest of a power grid or otherwise protect the power system from the detected fault. In one embodiment, IED 1000 may be communicatively coupled to a communications network (not shown). Upon detecting a fault via output 1061 of protection block 1002, IED 1000 may send a trip signal, transmit a message via the communications network alerting an engineer and/or removing the power system segment from the power system grid.

It will be obvious to those having skill in the art that many changes may be made to the details of the above-described embodiments without departing from the underlying principles disclosed herein. The scope of the disclosure should, therefore, be determined only by the following claims.

I claim:

1. A method for detecting a fault on a conductor by a first intelligent electronic device (IED) monitoring a power system segment having a first IED and a second IED receiving a time signal from a common time reference, comprising:
   obtaining a first set of current measurements and associated timestamp from a clock in communication with the common time reference;
   the first IED receiving a second set of current measurements and associated timestamp from a clock in communication with the common time reference, from the second IED;

the first IED time aligning the first set of current measurements and the second set of current measurements using the timestamps associated with the first and second sets of current measurements;

calculating a first symmetrical component from the time aligned first set of current measurements;

calculating a second symmetrical component from the time aligned second set of current measurements;

detecting the fault on the conductor using the first and second symmetrical components; and, nullifying the fault detection by not asserting a trip signal when an error in the measurements, clock, or time alignment is detected.

2. The method of claim 1, wherein the detecting comprises comparing an operating current to a scaled restraint current, wherein the operating current and scaled restraint current are derived from the time aligned current measurements.

3. The method of claim 1, wherein the detecting further comprises comparing an operating current to a scaled nominal current.

4. The method of claim 3, wherein the first and second symmetrical components comprise negative sequence components.

5. The method of claim 3, wherein the first and second symmetrical components comprise zero sequence components.

6. The method of claim 2, wherein the operating current corresponds to a sum of the time aligned current measurements.

7. The method of claim 2, wherein the scaled restraint current corresponds to a difference of the time aligned current measurements.

8. The method of claim 2, further comprising triggering an output in the power system segment if the operating current is greater than the scaled restraint current.

9. The method of claim 3, wherein the detecting triggers an output in the power system segment if the operating current is greater than the scaled nominal current.

10. The method of claim 2, wherein the scale of the scaled restraint current corresponds to an IED characteristic of the first and second IEDs.

11. The method of claim 1, wherein the detecting comprises comparing a real part of a dot product of the first symmetrical current component and a complex conjugate of the second symmetrical current component to zero.

12. The method of claim 1, wherein the second set of current measurements comprises a set of synchrophasors.

13. An apparatus for detecting a fault on a conductor by a first IED in a segment of a power system monitored by the first IED and a second IED receiving a time signal from a common time reference, comprising:

a current sensor to obtain a first set of current measurements at the first IED;

a communications interface to receive a second set of current measurements from the second IED, the second set of current measurements comprising a timestamp from a clock in communication with the common time reference;

a comparator to detect a fault in the segment using only a first set of time aligned current measurements derived from the first set of current measurements and a second set of time aligned current measurements derived from the second set of current measurements; and, a functional block to nullify the fault detection by not asserting a trip signal when an error in the measurements, clock or time alignment is detected.

14. The apparatus of claim 13, wherein the comparator is configured to time align the first set of current measurements to produce the first set of time aligned current measurements and to time align the second set of current measurements to produce the second set of time aligned current measurements.

15. The apparatus of claim 14, wherein the time aligning comprises modifying a magnitude of the second set of current measurements.

16. The apparatus of claim 15, wherein the first set of current measurement comprises a timestamp, and wherein the time aligning comprises modifying a magnitude of the first set of current measurements.

17. The apparatus of claim 15, wherein the time aligning comprises delaying the first set of current measurements relative to the set of second current measurements.

18. The apparatus of claim 14, wherein the second IED is configured to time align the second set of current measurements to a measurement interval based on a common time reference.

19. The apparatus of claim 18, wherein the current sensor is configured to obtain the first set of current measurements on a measurement interval based on the common time reference.

20. The apparatus of claim 14, wherein the comparator detects a fault in the segment by comparing an operating current to a scaled restraint current, wherein the operating current and scaled restraint current are derived from the first and second set of time aligned current measurements.

21. The apparatus of claim 20, wherein the comparator is configured to trigger a fault in the segment if an amplitude of the operating current is greater than an amplitude of the restraint current scaled by a restraint scale factor.

22. The apparatus of claim 20, wherein the scaled restraint current is further derived from a restraint scale factor that corresponds to a characteristic of the first IED and the second IED.

23. The apparatus of claim 14, wherein the comparator detects a fault in the segment by comparing a dot product of the first time aligned current measurement and a complex conjugate of the second time aligned current measurement to zero.

24. The apparatus of claim 13, wherein first and second sets of current measurements each correspond to one selected from the group consisting of a negative sequence component of a three-phase current, a positive sequence of three-phase current, and a zero component of three-phase current.

25. The apparatus of claim 13, wherein the second set of current measurements comprise a set of a synchrophasors.

26. The method of claim 1, wherein the step of nullifying the fault detection comprises de-asserting a fault signal.

27. The apparatus of claim 13, wherein the functional block nullifies the fault detection by de-asserting a fault signal.

* * * * *